(12) United States Patent
Elenius et al.

(10) Patent No.: US 8,487,437 B2
(45) Date of Patent: Jul. 16, 2013

(54) ELECTRONIC DEVICE PACKAGE AND METHOD FOR FABRICATING THE SAME

(75) Inventors: Peter Elenius, Scottsdale, AR (US); Deok Hoon Kim, Chungcheongbuk-do (KR); Young Sang Cho, Chungcheongbuk-do (KR)

(73) Assignee: Optopac Co., Ltd. (KR)

( * ) Notice: Subject to any disclaimer, the term of this patent is extended or adjusted under 35 U.S.C. 154(b) by 235 days.

(21) Appl. No.: 12/885,233

(22) Filed: Sep. 17, 2010

(65) Prior Publication Data
US 2011/0193231 A1    Aug. 11, 2011

(30) Foreign Application Priority Data
Feb. 8, 2010   (KR) .................. 10-2010-0011279

(51) Int. Cl.
*H01L 23/48* (2006.01)
(52) U.S. Cl.
USPC .................................. 257/750; 257/E23.023
(58) Field of Classification Search
USPC .......................................... 257/750, E23.023
See application file for complete search history.

(56) References Cited

U.S. PATENT DOCUMENTS

| | | | |
|---|---|---|---|
| 5,881,945 A | | 3/1999 | Edwards et al. |
| 6,441,478 B2* | | 8/2002 | Park ............................ 257/698 |
| 6,566,745 B1* | | 5/2003 | Beyne et al. .................. 257/680 |
| 7,714,369 B2* | | 5/2010 | Okumura et al. ............. 257/292 |
| 2006/0097335 A1* | | 5/2006 | Kim et al. ..................... 257/433 |
| 2007/0096177 A1* | | 5/2007 | Okumura et al. ............. 257/292 |

FOREIGN PATENT DOCUMENTS

| JP | 2005-045319 | 2/2005 |
|---|---|---|
| JP | 2006-303526 | 11/2006 |
| KR | 1019990044862 A | 6/1999 |
| KR | 1020020027220 A | 4/2002 |
| KR | 1020030045496 A | 6/2003 |
| KR | 1020060021072 A | 3/2006 |
| KR | 100788280 B1 | 12/2007 |
| KR | 1020090128431 A | 12/2009 |

* cited by examiner

*Primary Examiner* — Lex Malsawma

(57) ABSTRACT

An electronic device package includes a substrate assembly, an electronic device disposed to face the substrate assembly, and a sealing ring or rings including a sealing layer and a bonding layer that is disposed between the substrate assembly and the electronic device, wherein the sealing ring(s) has a closed loop shape surrounding a sealing region of the electronic device, and the bonding layer is formed through a reaction of the sealing layer and sealing layer pad with a low-melting-point material layer whose melting point is lower than that of the sealing layer and sealing ring pad. The bonding layer is formed of an intermetallic compound of the sealing layer, sealing ring pad and low-melting-point material that melts at a temperature greater than the melting temperature of the low-melting-point material. The device package also includes electrical connections in the form of joints between the substrate assembly and electronic device.

15 Claims, 6 Drawing Sheets

200(210,220,230)
300(310,320,330)
400(410,420,430)

200(210,220,230)
300(310,320,330)
400(410,420,430)

ELECTRONIC DEVICE PACKAGE AND METHOD FOR FABRICATING THE SAME

BACKGROUND

The present disclosure relates to an electronic device package and a method for fabricating the same, and more particularly, to an electronic device package and a method for fabricating the same, capable of preventing contamination and securely bonding an electronic device to the package substrate.

A photosensor is a semiconductor device that is capable of sensing light and providing an electrical output. Image sensors capture the image of an object or scene using an array of photosensors. The market for image sensors is rapidly growing as they are embedded in mobile phones as well as in a digital cameras and camcorders.

In general, the photosensor is an integrated circuit which includes one pixel or an array of pixels for sensing light in its central part, and terminals for transmitting electrical signals of the light sensed by the pixel(s) or other control inputs and outputs or power in its peripheral part. The photosensor may use a chip on board (COB) scheme where the photosensor is directly built into a camera module as a bare chip, or a chip scale package (CSP) scheme where a photosensor chip and a transparent substrate such as a glass substrate are combined and packaged, and then the CSP is built into the camera module. Recently, the CSP is commonly used since it can miniaturize a photosensor package.

Particles, moisture and so on must be prevented from entering the photosensor package, as particles entering into the photosensor package may attach to the pixel region of the photosensor and cause defects in the images. Furthermore, moisture flowing into the photosensor package can degrade the micro-lens or the color filter formed in the photosensor chip. Therefore, the pixel region of the photosensor package should be sufficiently sealed to prevent particles or moisture from entering the pixel region after the packaging.

Today a common method of protecting the pixel region is to use a sealing ring formed of a resin such as epoxy to surround the pixel region. However, the sealing ring formed using the resin cannot seal the pixel region sufficiently since moisture will diffuse through the resin into the pixel region. Moreover, when the photosensor chip is combined with the transparent substrate, a high pressure is generated in the pixel region during subsequent solder reflow processes due to this diffused moisture and thus there may be damage to the resin sealing ring when it is blown out by the high pressure in the pixel region.

To solve the above problem of the resin sealing ring, a solder material such as SnAg is used, and the sealing ring is formed to include an air vent through which the air is released when the solder material is bonded. Furthermore, this sealing ring has a spiral structure where one end surrounds the other end to include an air vent. However, since moisture in some cases may flow into the pixel region through the air vent in case of the sealing ring including the air vent, it is impossible to perfectly block the inflow of moisture. The vented sealing ring structure assures that the pressure inside the pixel area and outside the sealing ring are always at the same pressure, thus assuring that the sealing ring is never damaged during subsequent reflow processes.

Meanwhile, it is possible to form the sealing ring in a closed loop shape with SnAg solder having a low melting point. As this sealing ring is typically formed on top of a polymer layer on the photosensor, some moisture can still penetrate under the sealing ring and enter the pixel area. Thus during subsequent processing, such as SMT (Surface Mount Technology) reflow, the SnAg is in a liquid state and there may be a blowout phenomenon in a part of SnAg sealing ring due to the increase in pressure in the pixel area cavity.

SUMMARY

The present disclosure provides an electronic device package including a sealing ring capable of preventing foreign substances from entering a protected region of an electronic device such as a pixel region of a photosensor chip, wherein a defect such as the sealing ring blowout is not caused although the sealing ring is formed in a closed loop shape, and a method for fabricating the electronic device package.

The present disclosure provides an electronic device package where a sealing ring includes a stacked layer of a sealing layer and a bonding layer formed in a closed loop shape to prevent the inflow of a foreign substance and the occurrence of a defect such as the blowout of the sealing ring, and a method for fabricating the electronic device package.

The present disclosure provides an electronic device package where a sealing layer and a low-melting-point material layer are stacked, and then a bonding layer is formed by the reaction between the low-melting-point material layer, and a sealing ring pad and the sealing layer when the low-melting-point material layer melts, and a method for fabricating the electronic device package.

In accordance with an exemplary embodiment, an electronic device package includes: a substrate assembly; an electronic device disposed to face the substrate assembly; and at least one sealing ring including a sealing layer, a bonding layer and a sealing ring pad disposed between the substrate assembly and the electronic device, and one or more joints which are disposed inside the sealing ring, outside of the sealing ring or both inside and outside the sealing and connect the substrate assembly and the electronic device.

An internal empty space may be formed by the sealing ring, and the bonding layer may be an intermetallic compound.

The electronic device may include a photosensor, a micro electro mechanical systems (MEMS) device, a silicon base device, a GaAs base device, or an InP base device.

The substrate assembly may include an optically transparent substrate.

The sealing layer may be formed on one of the substrate assembly and the electronic device, and the low-melting-point material layer may be formed on the sealing layer.

The electronic device package may further include a sealing ring pad formed on the other one of the substrate assembly and the electronic device, wherein the sealing ring pad is formed in a region corresponding to a region where the sealing layer is formed.

The low-melting-point material layer may use a material whose melting point is lower than those of the sealing layer and the sealing ring pad.

The sealing layer may include one selected from the group consisting of Cu, Au, Sn, SnAg, SnAgCu, Ag, Ni and a combination thereof.

The low-melting-point material layer may include one selected from the group consisting of Sn, SnAg, Ti/In/Au, Bi, In and a combination thereof.

The sealing layer and the low-melting-point material layer may use one of Cu and Sn, Cu and SnAg, Au and a stacked structure of Ti/In/Au, Sn and Bi, SnAg and Bi, SnAgCu and Bi, Ag and In, and Ni and Sn.

The bonding layer may be formed of one selected from the group consisting of CuSn, CuSnAg, AuIn, SnBi, SnAgBi, SnAgCuBi, AgIn, NiSn and a combination thereof.

The low-melting-point material layer may react with the sealing layer and the sealing ring pad and be converted to the bonding layer, and the low-melting-point material layer may have a certain thickness so that the sealing layer and the sealing ring pad are firmly bonded to each other after the bonding layer is formed.

The certain thickness of the low-melting-point material layer may be in a range of approximately 2 µm to approximately 20 µm.

The electronic device package may further include a resin reinforcement formed at the outside of the sealing ring.

In accordance with another exemplary embodiment, a method for fabricating an electronic device package includes: forming a sealing layer and a low-melting-point material layer having a low melting point on either an electronic device or a substrate assembly, wherein the sealing layer and the low-melting-point material layer are stacked with each other; forming a sealing ring pad on the other one of the electronic device or the substrate assembly; disposing the electronic device and the substrate assembly so that the low-melting-point material layer corresponds to the sealing ring pad; and forming a bonding layer by making the low-melting-point material layer melt and react with the sealing layer and the sealing ring pad.

The sealing layer and the low-melting-point material layer may be formed in a closed loop shape.

The sealing layer and the low-melting-point material layer may be formed on the electronic device, and a joint may be formed apart from the sealing layer and the low-melting-point material layer.

The joint, the sealing layer and the low-melting-point material layer may be simultaneously formed with the same material.

The method may further include forming a sealing ring pad on a part of the substrate assembly corresponding to a region where the sealing layer is formed.

The method may further include forming a metal line apart from the sealing ring pad, and forming an insulation layer on at least part of the sealing ring pad and the metal line.

The sealing ring pad and the metal line may be simultaneously formed with the same material.

The bonding layer may be formed by performing thermal treatment on the low-melting-point material layer to form an intermetallic compound that is different from the low-melting-point material layer.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
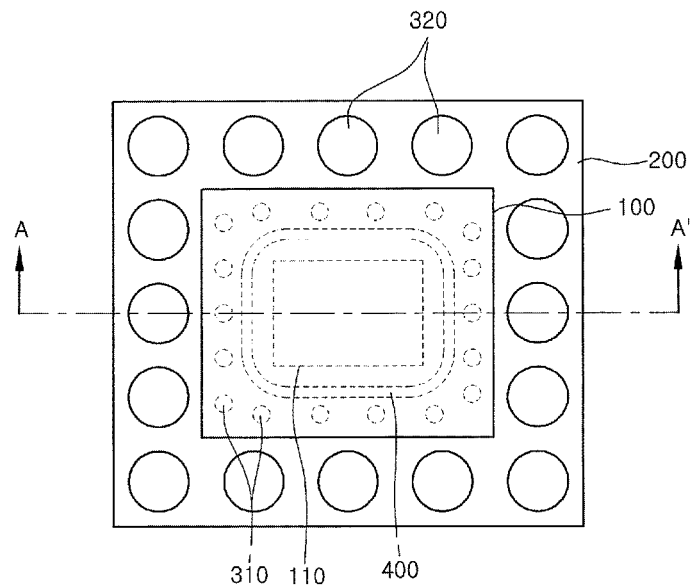
FIG. 1 is a plane view of a photosensor package in accordance with an embodiment of the present invention.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Furthermore, the same or like reference numerals represent the same or like constituent elements, although they appear in different embodiments or drawings of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
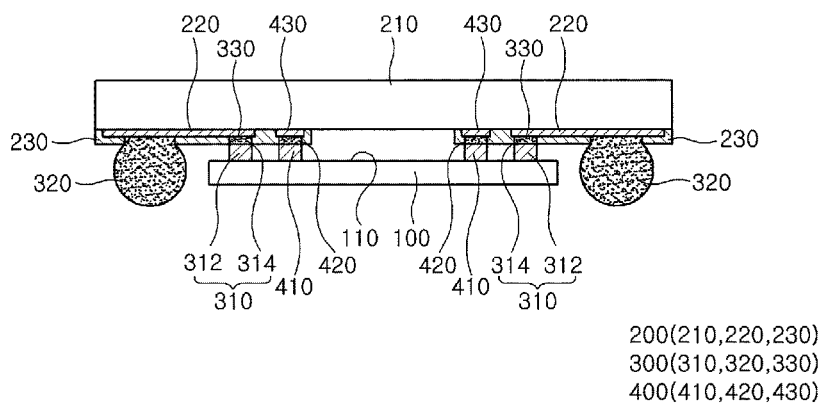
FIG. 2 is a cross-sectional view taken along a line A-A' of FIG. 1.
Figure 4A:
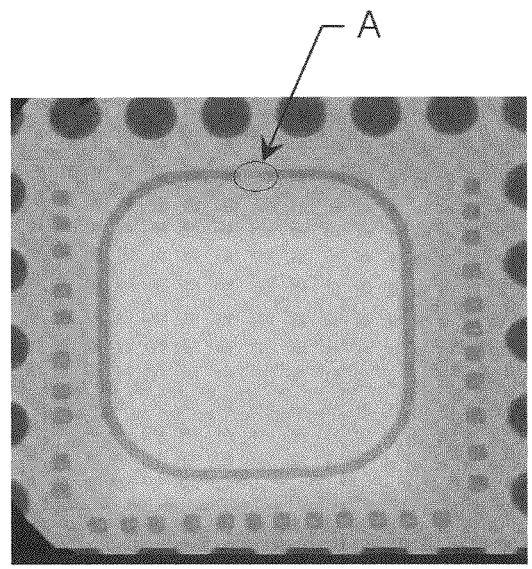
FIGS. 4A and 4B are a plane image and a cross-sectional image of a conventional sealing ring formed of SnAg where the blowout occurs, respectively.
Figure 4B:
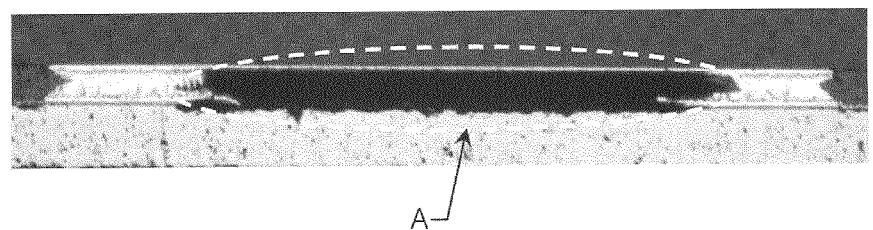
Figure 5:
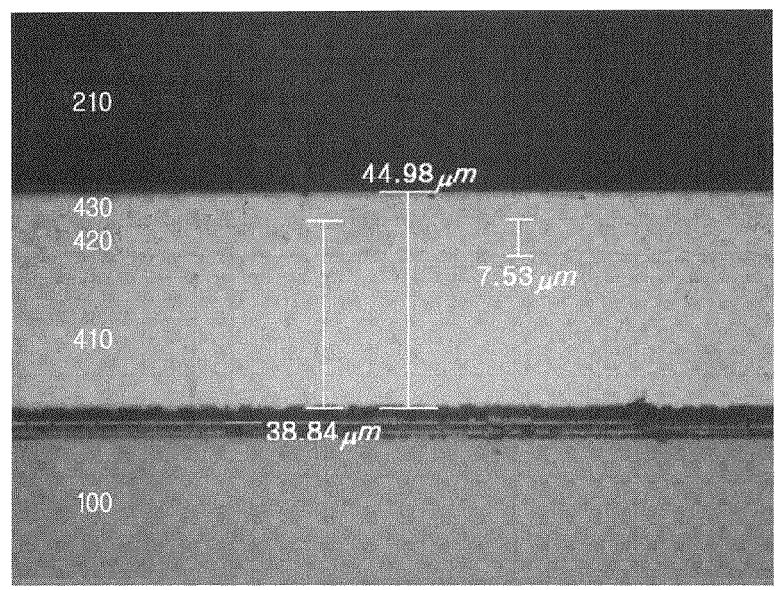
FIG. 5 is a cross-sectional image of a sealing ring using copper and SnAg in accordance with an embodiment of the present invention.
Figure 6:
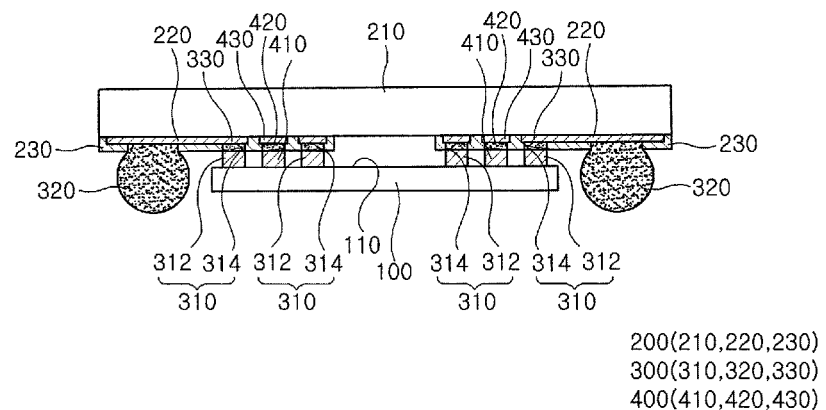
FIGS. 6 and 7 are cross-sectional views of photosensor packages in accordance with other embodiments of the present invention.
Figure 7:
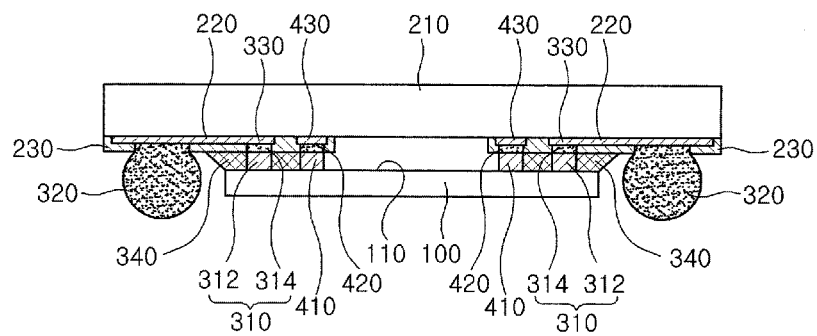

FIG. 1 is a plane view of a photosensor package in accordance with an embodiment of the present invention, and FIG. 2 is a cross-sectional view taken along a line A-A' of FIG. 1. FIGS. 3A to 3E illustrate a method for fabricating the photosensor package in accordance with the embodiment of the present invention; FIGS. 4A and 4B are a plane image and a cross-sectional image of a conventional sealing ring formed of SnAg where the blowout occurs, respectively; FIG. 5 is a cross-sectional image of a sealing ring using copper and SnAg in accordance with an embodiment of the present invention; and FIGS. 6 and 7 are cross-sectional views of photosensor packages in accordance with other embodiments of the present invention.

Referring to FIGS. 1 and 2, the photosensor package in accordance with the embodiment of the present invention includes a photosensor chip 100 for sensing images, a substrate assembly 200 disposed to face the photosensor chip 100 and electrically connected to the photosensor chip 100, a plurality of joints 300 for electrically connecting the photosensor chip 100, the substrate assembly 200 and a printed circuit board (not shown), and a sealing ring 400 for preventing a foreign substance from entering into a pixel region 110 of the photosensor chip 100.

The photosensor chip 100 includes the pixel region 110 disposed at its central part to sense images, and a terminal region (not shown) disposed at its peripheral part to transmit electrical signals of the images acquired in the pixel region 110, to transceive other signals, or to supply power. The pixel region 110 may include a plurality of photodiodes for converting the light to the electrical signals, color filters, i.e., red, green and blue, disposed on the photodiodes to resolve colors, and a micro lens, disposed on the color filters, for focusing the light on the photodiodes and thus enhancing the sensitivity of the photosensor chip. The photodiodes, the color filters and the micro lens may be stacked upon each other.

The substrate assembly 200 includes a transparent substrate 210, e.g., an optically transparent substrate, a metal line 220 selectively formed on one side of the transparent substrate 210 where the photosensor chip 100 is disposed, and an insulation layer 230 formed on the metal line 220 to insulate the metal line 220. The transparent substrate 210 may be formed in a rectangular shape having a certain thickness with a transparent material such as glass and plastic. An optical material may be coated on one side of the transparent substrate 210 where the metal line 220 is formed and/or the other side of the transparent substrate 210 where the metal line 220 is not formed, thereby performing filtering of light, or improving the transmission of light in a desired wavelength band. For instance, an infrared (IR) cut-off filter (not shown) for blocking the light in a certain wavelength band or an anti reflection coating (ARC) to improve the transmission of light is coated on one or both sides of the transparent substrate 210. The metal line 220 is formed on one side of the transparent substrate 210 and in an outside region surrounding a region corresponding to the pixel region 110. The metal line 220 may be patterned using a printing process or patterned through photolithography and etching processes after depositing a metallic material that may or may not include a plating process. Moreover, the insulation layer 230 is formed on the metal line 220 to expose a certain portion of the metal line 220. That is, the certain portion of the metal line 220 that is connected to the solder ball terminal 320 and the photosensor chip 100 is exposed by the insulation layer 230. The portion of the metal line 220 exposed by the insulation layer 230 serves as a solderable pad for solder ball terminal 320. The insulation layer 230 may be also patterned through the printing process or patterned through standard photolithography processes after depositing the insulation material.

There are a plurality of joints 300 for electrically connecting the photosensor chip 100 and the substrate assembly 200, and a plurality of solder ball terminals 320 for electrically connecting the substrate assembly 200 and a printed circuit board (not shown). The plurality of joints 300 are disposed between the substrate assembly 200 and the photosensor chip 100 outside the sealing ring 400. The joints 300 may be disposed both inside and outside of the sealing ring 400 as illustrated in FIG. 6, or inside of the sealing ring 400. The joint component 310 may be formed on a certain portion of the photosensor chip 100 and include a conductive layer 312 and a low-melting-point material layer 314a (see FIG. 3A) on top of the conductive layer 312. The joint component 310 may be formed with the same material and in the same structure as the sealing ring structure 410 and 420 that are to be described. The conductive layer 312 of the joint component 310 may be formed of a conductive material such as copper (Cu), and the bonding layer 314 of the joint 300 may be formed as a result of the conductive layer 312 and the joint pad 330 reacting with a material having a low melting point 314a such as SnAg whose melting point is lower than those of the conductive layer 312 and the joint pad 330. Namely, the bonding layer 314 is formed as a result of conductive layer 312 and/or joint pad 330 reacting with low-melting-point material layer 314a to form a compound that melts at a higher temperature than the low-melting-point material layer 314a. For instance, the SnAg layer 314a reacts with copper used as the joint pad 330 and the supporting layer, i.e., the conductive layer 312, to thereby form the bonding layer 314 of CuSnAg intermetallic compounds. In the meantime, the plurality of solder ball terminals 320 are joined to the metal lines 220 of the substrate assembly 200 at the outside of the photosensor chip 100, thereby electrically connecting the substrate assembly 200 and the printed circuit board. Herein, the plurality of solder ball terminals 320 are formed at intervals along an outer line of the transparent substrate 210 having, e.g., a rectangular shape. Furthermore, at least one of the solder ball terminals 320 may be removed, and at least one passive device (not shown) may be embodied instead of the removed solder ball. The passive device may include one or more of a decoupling capacitor, an inductor, a resistor and a filter and acts as a part to remove electrical noise or modification of the signals transmitted between the printed circuit board and the photosensor chip 100.

The sealing ring 400 is disposed between the photosensor chip 100 and the substrate assembly 200 to surround a sealing region including the pixel region 110 of the photosensor chip 100, and prevents a foreign substance from entering into the space within the sealing region between the substrate assembly 200 and the photosensor chip 100. The sealing ring structure includes a sealing layer 410 formed on the photosensor chip 100 and a low-melting-point material layer 420a (See FIG. 3A) formed on the sealing layer 410. The sealing ring structure further includes a sealing ring pad 430 formed on a certain portion of the transparent substrate 210. The sealing layer 410 of the seal ring 400 may be formed of a material such as copper (Cu), and the bonding layer 420 is formed as a result of the sealing layer 410 and the sealing ring pad 430 reacting with a material having a low melting point 420a such as SnAg whose melting point is lower than those of the sealing layer 410 and the sealing ring pad 430. Namely, the bonding layer 420 is formed as a result of sealing layer 410 and/or sealing ring pad 430 reacting with the low-melting-point material layer 420a to form a compound that melts at a higher temperature than the low-melting-point material layer 420a. For instance, the SnAg layer 420a reacts with copper used for the sealing ring pad 430 and the sealing layer 410, to thereby form the bonding layer 420 of CuSnAg intermetallic compounds. The sealing ring 400 may have a closed loop shape surrounding the pixel region 110. That is, a space sealed from the outside is formed by the transparent substrate 210, the photosensor chip 100 and the sealing ring 400 that are bonded together, and the pixel region 110 is disposed in the space sealed from the outside. At this time, the sealing layer 410 is formed in the closed loop shape to surround the pixel region 110, and the low-melting-point material layer 420a is formed on the sealing layer 410. Meanwhile, the insulation layer 230 is formed on the sealing ring pad 430, and a part of the sealing ring pad 430 may be exposed by the insulation layer 230. The sealing ring pad 430 may be formed using the same material as that of the metal line 220 of the substrate assembly 200 through the same process as forming the metal line 220. The sealing ring pad 430 may be electrically connected with the metal line 220. In accordance with another embodiment of the present invention, the sealing layer 410 may be formed on the transparent substrate 210. In this case, the sealing ring pad 430 may be formed on the photosensor chip 100. In the meantime, the sealing layer 410 and the sealing ring pad 430 may be formed using a metallic material such as copper. The low-melting-point material layer 420a may be formed of a low-melting-point material layer having a melting point lower than those of the sealing layer 410 and the sealing ring pad 430 and then making the low-melting-point material layer 420a react with the sealing layer 410 and the sealing ring pad 430. For instance, the sealing layer 410 and sealing ring pad 430 may use one selected from the group consisting of Cu, Au, Sn, SnAg, CuSnAg, Ag, Bi, a combination thereof and an alloy thereof, and the low-melting-point material layer 420a having a melting point lower than that of the sealing layer 410 and sealing ring pad 430 may use a material selected from the group consisting of Sn, SnAg, a stacked structure of Ti/In/Au, Bi, In, a combination thereof and an alloy thereof. That is, the low-melting-point material layer 420a may use a material whose melting point is lower than that of the sealing layer 410 or sealing ring pad 430. Meanwhile, a material that may be used as the low-melting-point material layer may be used as the sealing layer 410 or sealing ring pad 430. However, in this case, a material having a melting point lower than that of the sealing layer 410 or sealing ring pad 430 should be used as the low-melting-point material layer. For example, the sealing layer 410 or sealing ring pad 430 and the low-melting-point material layer may use Cu and Sn, Cu and SnAg, Au and a stacked structure of Ti/In/Au, Sn and Bi, SnAg and Bi, CuSnAg and Bi, Ag and In, or Ni and Sn, respectively. The low-melting-point material layer melts at a certain temperature and thus reacts with the sealing ring pad 430 and the sealing layer 410 to form the bonding layer 420. That is, the low-melting-point material layer melts and reacts with elements of the sealing ring pad 430 and the sealing layer 410 to thereby form the bonding layer 420 that melts at a higher temperature than the low-melting-point material. The bonding layer 420 is formed as an intermetallic compound having a certain composition ratio that has metallurgical characteristics different from those of the sealing layer 410, the sealing ring pad 430 and the low-melting-point material layer 420a. The bonding layer 420 has a melting point higher than that of the low-melting-point material layer. For instance, if the sealing layer 410 and the sealing ring pad 430 use copper, and the material having the low melting point uses SnAg, the SnAg melts and thus reacts with copper at its upper and lower portions, so that the bonding layer 420 of CuSnAg intermetallics is formed. The bonding layer 420 is formed in a solid state, and thus the sealing layer 410 and the sealing ring pad 430 are firmly joined by the bonding layer 420. As a result, the photosensor chip 100 is combined with the substrate assembly 200. The bonding layer 420 formed as described above has a melting point higher than that of the low-melting-point material layer. For instance, CuSnAg intermetallics have a melting point of 400☐ to 500☐, and thus it does not melt during a reflow process of 260☐. As a result, there is no possibility of a defect such as the blowout of the seal ring by increased pressure inside the cavity formed by the seal ring. In the meantime, the bonding layer 420 may be formed of various materials depending on the low-melting-point material layer and elements constructing the sealing ring pad 430 and the sealing layer 410 that react with the low-melting-point material layer. For instance, the bonding layer 420 may include CuSn, CuSnAg, AuIn, SnBi, SnAgBi, CuSnAgBi, AgIn, or NiSn. Meanwhile, the thickness of the sealing layer 410 changes depending the spacing between the photosensor chip 100 and the substrate assembly 200. For instance, the sealing layer 410 may have a thickness of 6 μm to 100 μM and, preferably, 30 μm. The low-melting-point material layer may be formed with a thickness of 2 μm to 20 μm and, preferably, 8 μm. It is preferable that the low-melting-point material layer is formed with a certain thickness that is enough to be fully changed to the bonding layer 420. That is, the low-melting-point material layer is formed to have a thickness such that all elements of the low-melting-point material layer are converted to the bonding layer 420 of an intermetallic compound. Therefore, the thickness of the low-melting-point material layer is not limited to the above range, and it is preferable that the low-melting-point material layer is formed to have a thickness as much as it fully reacts with the sealing layer 410 and the sealing ring pad 430 so that all of it can be converted to the bonding layer 420. At that time, if the thickness of the low-melting-point material layer is too small, the bonding layer 420 is formed to have a small thickness, and thus the joint formed between the bonding layer 420 and the substrate assembly 200 is degraded. On the other hand, if the thickness of the low-melting-point material layer is too great, the low-melting-point material layer may not be fully converted to the bonding layer 420. As a result, if the low-melting-point material layer is not fully converted to the bonding layer 420, the remaining part of the low-melting-point material layer melts again in a subsequent processes that are performed at temperatures greater than the melting point of the low-melting-point material layer, and thus the blowout phenomenon may occur in the low-melting-point material layer that is in a liquid state by an increasing internal pressure inside the seal ring cavity. The low-melting-point material layer may not fully convert to an intermetallic compound even with increased processing temperatures or longer processing times. Thus, if the thickness of the low-melting-point material layer is greater than a certain level, a part of the low-melting-point material layer remains. As a result, the bonding layer 420 may not be formed for that part, or that part may cause a defect in a subsequent process. Therefore, it is preferable that the low-melting-point material layer is formed with a certain thickness so that the low-melting-point material layer is fully converted to the bonding layer 420, and thus the photosensor chip 100 is firmly joined with the substrate assembly 200.

In the meantime, the printed circuit board (not shown) may be connected to the solder ball terminal 320 by a connection pad, and a voltage and a current from the outside are supplied to the photosensor chip 100 through the substrate assembly 200 since wiring patterns are formed on the printed circuit board. The printed circuit board may include various types such as a one-layer or multi-layer printed circuit board, a metal core printed circuit board, and a flexible printed circuit that are capable of electrically interfacing to the photosensor chip 100 through the solder joints formed by solder ball terminal 320 and the connection pad on the printed circuit board.

As described above, in the photosensor package in accordance with the embodiment of the present invention, the sealing ring 400 is formed by the sealing layer 410 and the bonding layer 420 that are stacked with each other, and the photosensor chip 100 and the substrate assembly 200 are firmly joined by strongly bonding the sealing layer 410 and the sealing ring pad 430 on the transparent substrate 210 with the bonding layer 420. Herein, the bonding layer 420 is formed by using a low-melting point material layer whose melting point is lower than those of the sealing layer 410 and the sealing ring pad 430, and the bonding layer 420 is formed as the low-melting-point material layer melts and reacts with the sealing layer 410 and the sealing ring pad 430. Therefore, since the sealing layer 410 having a high melting point does not melt in a subsequent process performed at a high temperature such as a 260° C. solder reflow process, the defect such as the blowout does not occur in the sealing ring 400. As a result, the sealing ring 400 can be formed in the closed loop shape and prevent the inflow of foreign substances such as particles and moisture from the outside.

A method for fabricating the photosensor package in accordance with the above embodiment of the present invention includes forming the low-melting-point material layer and the sealing layer in the closed loop shape on either the photosensor chip or the substrate assembly, forming the sealing ring pad on the other one of the photosensor chip or the substrate assembly to correspond to the low-melting-point material layer, making the low-melting-point material layer contact the sealing ring pad, and heating the low-melting-point material layer to a temperature higher than its melting point to make the low-melting-point material layer melt and react with the sealing layer and the sealing ring pad, thereby forming the bonding layer. The method for fabricating the photosensor package will be described in detail with reference to FIGS. 3A to 3E.

FIGS. 3A to 3E illustrate the method for fabricating the photosensor package in accordance with the embodiment of the present invention.

Figure 3A:
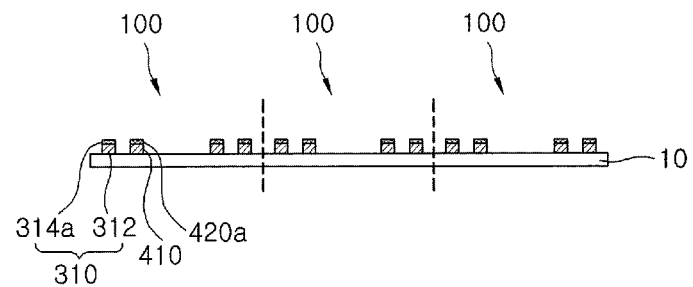
FIGS. 3A to 3E illustrate a method for fabricating the photosensor package in accordance with the embodiment of the present invention.

Referring to FIG. 3A, a conductive layer 312 and a sealing layer 410 are formed on a photosensor wafer 10 including a plurality of photosensor chips 100, and material layers having low melting points, i.e., low-melting-point material layers, 314a and 420a are formed on the conductive layer 312 and the sealing layer 410, respectively. Herein, the conductive layer 312 and the low-melting-point material layer 314a are used to form a joint, and the sealing layer 410 and the low-melting-point material layer 420a are used to form a sealing ring. The conductive layer 312 and the sealing layer 410 may be formed to have a certain interval therebetween, and the sealing layer 410 may be formed in a closed loop shape. The photosensor chip 100 includes a pixel region for sensing images at its central part and a terminal region at its peripheral part around the pixel region or alternatively inside the area bounded by the sealing ring. In the pixel region, there are a plurality of photodiodes for converting the light to electrical signals, color filters of red, green and blue, may be disposed on the photodiodes, for extracting colors, and a micro lens, may be disposed on the color filter, for enhancing the sensitivity by focusing the light onto the photodiodes, wherein the photodiodes, the color filters and the micro lens may be formed in a stacked structure. The low-melting-point material layers 314a and 420a use a material whose melting point is lower than those of the conductive layer 312 and the sealing layer 410. For instance, the conductive layer 312 and the sealing layer 410 may use Cu, Au, Sn, SnAg, CuSnAg, Ag, or Ni, and the low-melting-point material layers 314a and the 420a may use Sn, SnAg, a stacked structure of Ti/In/Au, Bi, or In alone or in a combination thereof. Meanwhile, the material that is able to be used as the conductive layer 312 and the sealing layer 410 may be used as the low-melting-point material layers 314a and 420a. However, in case the conductive layer 312 and the sealing layer 410 use a material having a low melting point, the low-melting-point material layers 314a and the 420a should use a material whose melting point is lower than that of the material used as the conductive layer 312 and the sealing layer 410. For example, the conductive layer 312 and the sealing layer 410, and the low-melting-point material layers 314a and 420a may use Cu and Sn, Cu and SnAg, Au and the stacked structure of Ti/In/Au, Sn and Bi, SnAg and Bi, SnAgCu and Bi, Ag and In, or Ni and Sn that are stacked with each other. In the meantime, the conductive layer 312, the sealing layer 410 and the low-melting-point material layer 314a and 420a may be formed using an electroplating, sputtering, evaporation or printing method, and a bonding layer may be formed on the photosensor wafer 10 to improve the adhesion between the photosensor wafer 10, and the conductive layer 312 and the sealing layer 410. In the electroplating method, a seed layer may be formed on the bonding layer to perform the electroplating of the conductive layer 312 and the sealing layer 410.

Figure 3B:
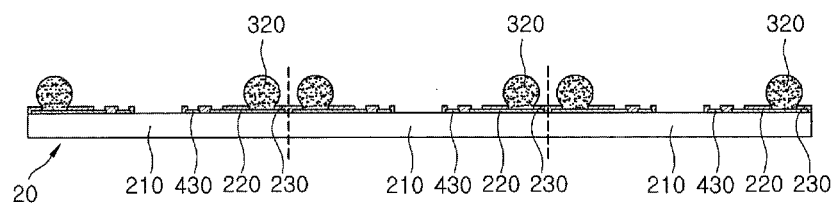

A transparent substrate 20 is processed through a separate process from the process for processing the photosensor wafer 10, and this will be described with reference to FIG. 3B. The transparent substrate 20 can be in form of a wafer, typical of those processed in the semiconductor industry. At this time, a batch process may be applied to simultaneously fabricate a lot of unit substrates 210 using the wafer 20 having a large area. In this embodiment of the present invention, the transparent wafer 20 having transmissivity, thermal stability, mechanical endurance, and chemical stability may be used. In case of a photosensor for sensing a general visible light band, the transparent wafer 20 uses an optical glass that satisfies the above properties. An optical layer may be formed on one or the other side of the transparent wafer 20. For instance, an IR cutoff filter (not shown) or an IR cutoff film (not shown) may be formed on the transparent wafer 20 to transmit or block the light in different wavelength bands. Furthermore, an anti-reflection coating layer for increasing the transmission of light may be formed on the transparent wafer 20. On the transparent wafer 20, at least one layer with one metal line 220 and at least one insulation layer 230 are formed. Moreover, a sealing ring pad 430 may be formed apart from the metal line 220. That is, the metal line 220 and the sealing ring pad 430 are formed on one side of the transparent wafer 20, and the insulation layer 230 is formed on the transparent wafer 20 to partially cover the sealing ring pad 430 and the metal line 220 so that parts of the metal line 220 and the sealing ring pad 430 are exposed. As a result that the metal line 220 and the insulation layer 230 are formed, electrical input/output connection terminals and an electrical line for electrically connecting the electrical input/output connection terminals are formed. The metal line 220 and the sealing ring pad 430 may be simultaneously formed using the same material and through the same process. For instance, the metal line 220 and the sealing ring pad 430 are formed by depositing a metal layer on one side of the transparent substrate 210 through a metal sputtering process and patterning the metal layer through photolithographic and etching processes, or forming a patterned metal layer by electroplating in a resist layer defined by photolithographic processes. The insulation layer 230 may be formed using an inorganic insulation material such as silicon dioxide layer or silicon nitride or organic insulation materials including polyimides, polybenzoxazoles, epoxies and various other polymers. That is, the insulation layer 230 is formed by depositing such an insulation material and patterning the deposited insulation material through the photolithographic processes and developing or etching processes depending on the material type. The insulation layer 230 is formed to partially expose the metal line 220 and the sealing ring pad 430. Herein, the sealing ring pad 430 may be formed in a region corresponding to the low-melting-point material layer 420a and the sealing layer 410 formed on the photosensor wafer 10, and it may be formed in the closed loop shape. A solder ball terminal 320 may be formed on the transparent substrate 210 as a terminal for connecting the photosensor package and the printed circuit board. For this purpose, the terminal is formed by coating flux on an outer side of the transparent wafer 20, e.g., the metal line 220, through printing or a similar method thereto, attaching solder having a ball shape, i.e., the solder ball, onto the flux, and performing a solder reflow process. After performing the solder reflow process, the flux residue may be removed through a cleaning process.

Figure 3C:
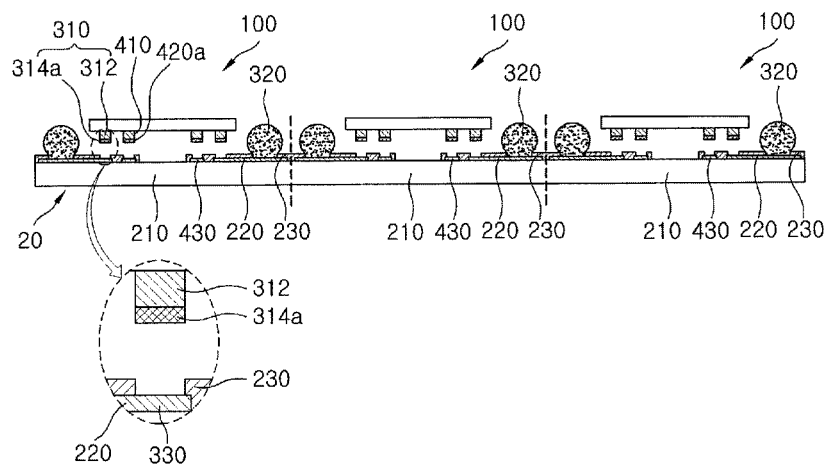

Through the above processes, the processing of the photosensor wafer 10 and the transparent wafer 20 are completed. After that, as illustrated in FIG. 3C, the photosensor chips 100 are separated from each other by dicing the photosensor wafer 10 along a dicing line. Then, only a good photosensor chip 100 is disposed on each unit transparent substrate 210 of the transparent wafer 20 using flip chip mounting equipment. That is, the photosensor chip 100 is disposed on the transparent wafer 20 so that the sealing layer 410 and the low-melting-point material layer 420a of the photosensor chip 100 face the sealing ring pad 430 of the unit transparent substrate 210. Also the conductive layer 312 and the low-melting-point material layer 314a of the photosensor chip 100 face the joint pad 330 of the unit transparent substrate.

Figure 3D:
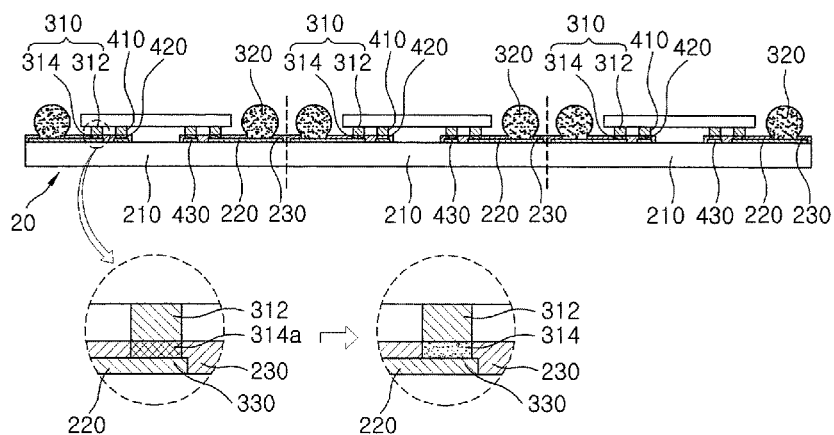

Referring to FIG. 3D, the transparent wafer 20 on which the photosensor chips 100 are disposed goes through a reflow oven with an appropriate oxide reducing atmosphere having a temperature higher than melting points of the low-melting-point material layers 314a and 420a. Thus, the low-melting-point material layers 314a and 420a melt, and then each element of the low-melting-point material layers 314a and 420a reacts with elements of the conductive layer 312 and the metal line 220 and elements of the sealing layer 410 and the sealing ring pad 430, so that bonding layers 314 and 420 are formed. The sealing layer 410 and the low-melting-point material layer 420a use Cu and Sn, Cu and SnAg, Au and a stacked structure of Ti/In/Au, Sn and Bi, SnAg and Bi, CuSnAg and Bi, Ag and In, or Ni and Sn, respectively, to form the bonding layer 420 including CuSn, CuSnAg, AuIn, SnBi, SnAgBi, CuSnAgBi, AgIn, or NiSn. As a result, there are formed at least one joint 300 including the conductive layer 312, bonding layer 314 and joint pad 330 and the sealing ring 400 including the sealing layer 410, the bonding layer 420 and sealing ring pad 430.

Figure 3E:
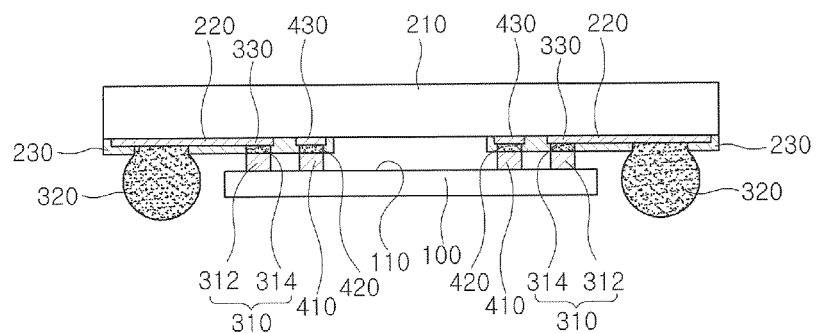

Referring to FIG. 3E, the photosensor package in accordance with the embodiment of the present invention is accomplished by dividing the transparent wafer 20 into unit packages through the dicing process.

FIGS. 4A and 4B are an x-ray plane image and a cross-sectional image of a conventional sealing ring of SnAg in a closed loop shape, where a defect such as the solder blowout has occurred. That is, although it is possible to form the sealing ring in the closed loop shape using SnAg, there may occur the blowout A at a part of the sealing ring by an increase in internal pressure inside the sealing ring since the SnAg solder is in a liquid state during a high temperature process such as a 260° C. solder reflow process. After the blowout occurs, the sealing ring cannot prevent the ingress of foreign particles or liquids from the outside through the part where the blowout occurs, resulting in contamination of the pixel(s) and photosensor failure.

FIG. 5 is a cross-sectional image in case a CuSn bonding layer is formed by making a low-melting-point material layer using SnAg react with a sealing ring and a sealing ring pad formed of Cu in accordance with an embodiment of the present invention. That is, after the sealing ring pad 430 using Cu is formed on the glass substrate 210 and the low-melting-point material layer 420a using SnAg and the sealing layer 410 using Cu are formed on the photosensor chip 100, the CuSnAg bonding layer 420 is formed as Cu reacts with SnAg at a temperature higher than the melting point of the low-melting-point material layer 420a. Herein, since the CuSnAg intermetallic bonding layer has a melting point of 400□ to 500□, it does not melt in a reflow process performed at a temperature of 206□ typical of common SMT reflow processes, and thus there does not occur the blowout phenomenon in the bonding layer. Meanwhile, in the cross-sectional image, a layer between the photosensor chip 100 and the sealing layer 410 is a material layer such as a color filter and a micro lens.

FIGS. 6 and 7 are cross-sectional views of photosensor packages in accordance with other embodiments of the present invention.

FIG. 6 illustrates that the joints 300 may be disposed both inside and outside of the sealing ring 400. Alternately, the joints 300 may be disposed inside the sealing ring 400.

FIG. 7 illustrates the photosensor package including resin reinforcement 340 allocated outside the sealing ring 400, and between a substrate assembly 200 and a photosensor chip 100. It is possible to mechanically strengthen the joints 300 and sealing ring 400 using the resin reinforcement 340.

Although the above embodiments illustrate the photosensor package combining the photosensor chip 100 and the substrate assembly 200, they can be applied to various electronic device packages in addition to the photosensor package. That is, the present invention can be applied to various electronic device packages where a sealing ring is formed to combine a substrate assembly and an electronic device chip such as a micro electro mechanical systems (MEMS) device, a silicon base device, a GaAs base device, and an InP base device and to seal a protected region between the electronic device chip and the substrate assembly. Herein, the silicon base device includes a semiconductor memory device using a silicon substrate and polysilicon, and a GaAs device and an InP device and a light emitting device such as a light emitting diode that use a variety of device materials. The substrate assembly in some of these applications does not need to be transparent to light and can be made of materials such as silicon, ceramics or other non-transparent materials.

In the electronic device package in accordance with the embodiment of the present invention, the sealing ring is formed by the sealing layer and the bonding layer that are stacked with each other, and an electronic device and the substrate assembly are firmly joined as the bonding layer firmly bonds the sealing ring pad on the substrate assembly to the sealing layer. Herein, the bonding layer which is an intermetallic is formed as a result of the low-melting-point material layer melting and thus reacting with the sealing layer and the sealing ring pad.

Therefore, since the melting point of the bonding layer becomes higher than that of the low-melting-point material layer, and therefore the bonding layer and the sealing layer having a high melting point and do not melt in a high temperature process such as a subsequent reflow process, there does not occur a defect such as the blowout of the sealing ring. As a result, it is possible to form the sealing ring in the closed loop shape and to block the inflow of foreign substances such as particles and the moisture from the outside.

Moreover, it is possible to prolong the life and to improve properties of the electronic device package by firmly combining the electronic device and the substrate assembly. Since it is possible to use general fabrication processes, the productivity can be improved, and the present invention is applicable to various electronic device packages, where the sealing ring surrounds the protected region, and the electronic chip is combined with the substrate assembly, in addition to the photosensor package.

Although the exemplary deposition apparatus has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. An electronic device package, comprising:
a substrate assembly;
an electronic device with a sealing area disposed to face the substrate assembly;
at least one sealing ring including a sealing layer, a bonding layer and a sealing ring pad disposed between the substrate assembly and the electronic device; and
joints which are disposed inside, outside or on both sides of the sealing ring and connect the substrate assembly and the electronic device,
wherein the sealing ring has a closed loop shape surrounding the sealing area of the electronic device with one end of the sealing ring being in contact with the other end, and wherein the sealing layer, the bonding layer and the sealing ring pad are vertically stacked to form the sealing ring.

2. The electronic device package of claim 1, wherein an internal cavity is formed by the sealing ring.

3. The electronic device package of claim 1, wherein the electronic device comprises a photosensor, a micro electro mechanical systems (MEMS) device, a silicon device, a GaAs device, or an InP device.

4. The electronic device package of claim 1, wherein the substrate assembly comprises an optically transparent substrate.

5. The electronic device package of claim 1, wherein the bonding layer is formed of an intermetallic compound composed of the materials of the sealing layer, sealing ring pad and a low-melting point layer.

6. The electronic device package of claim 5, wherein the sealing ring is formed on one of the substrate assembly and the electronic device, and the low-melting-point material layer is formed on the sealing layer.

7. The electronic device package of claim 6, further comprising a sealing ring pad formed on the other one of the substrate assembly and the electronic device, wherein the sealing ring pad is formed in a region corresponding to the sealing layer.

8. The electronic device package of claim 7, wherein the low-melting-point material layer uses a material whose melting point is lower than those of the sealing layer and the sealing ring pad.

9. The electronic device package of claim 8, wherein the sealing layer comprises one selected from the group consisting of Cu, Au, Sn, SnAg, SnAgCu, Ag, Ni and a combination thereof.

10. The electronic device package of claim 8, wherein the low-melting-point material layer comprises one selected from the group consisting of Sn, SnAg, Ti/In/Au, Bi, In and a combination thereof.

11. The electronic device package of claim 8, wherein the sealing layer and the low-melting-point material layer use, respectively, one of Cu and Sn, Cu and SnAg, Au and a stacked structure of Ti/In/Au, Sn and Bi, SnAg and Bi, SnAgCu and Bi, Ag and In, and Ni and Sn.

12. The electronic device package of claim 11, wherein the bonding layer is formed of one selected from the group consisting of CuSn, CuSnAg, AuIn, SnBi, SnAgBi, SnAgCuBi, AgIn, NiSn and a combination thereof.

13. The electronic device package of claim 8, wherein the low-melting-point material layer reacts with the sealing layer and the sealing ring pad to form the bonding layer substantially without remnants of the low-melting-point material layer, and the low-melting-point material layer has a thickness so that the sealing layer and the sealing ring pad are firmly bonded to each other after the bonding layer is formed.

14. The electronic device package of claim 13, wherein the thickness of the low-melting-point material layer is in a range of approximately 2 μm to approximately 20 μm.

15. The electronic device package of claim 1, further comprising resin reinforcement formed at the outside of the sealing ring.

* * * * *